(12) United States Patent
Villain et al.

(10) Patent No.: US 8,140,044 B2
(45) Date of Patent: Mar. 20, 2012

(54) MIXER CIRCUIT AND METHOD OF OPERATION

(75) Inventors: Frederic F. Villain, Caen (FR); Olivier Burg, Caen (FR)

(73) Assignee: ST-Ericsson SA, Geneva (CH)

( * ) Notice: Subject to any disclaimer, the term of this patent is extended or adjusted under 35 U.S.C. 154(b) by 251 days.

(21) Appl. No.: 12/306,640

(22) PCT Filed: Jun. 15, 2007

(86) PCT No.: PCT/IB2007/052298
§ 371 (c)(1),
(2), (4) Date: Oct. 13, 2009

(87) PCT Pub. No.: WO2008/001256
PCT Pub. Date: Jan. 3, 2008

(65) Prior Publication Data
US 2010/0048152 A1 Feb. 25, 2010

(30) Foreign Application Priority Data

Jun. 27, 2006 (EP) .................................... 06300726

(51) Int. Cl.
*H04B 1/26* (2006.01)
(52) U.S. Cl. .................. 455/313; 455/333; 455/118
(58) Field of Classification Search .......... 455/313–334, 455/118
See application file for complete search history.

(56) References Cited

U.S. PATENT DOCUMENTS

| 5,630,228 | A | * | 5/1997 | Mittel | 455/326 |
| 5,945,878 | A | | 8/1999 | Westwick et al. | |
| 2001/0021645 | A1 | | 9/2001 | Ugajin et al. | |
| 2002/0058492 | A1 | | 5/2002 | Souetinov et al. | |
| 2004/0160265 | A1 | * | 8/2004 | Fiedler | 327/355 |
| 2005/0227723 | A1 | * | 10/2005 | Lee et al. | 455/522 |

FOREIGN PATENT DOCUMENTS

EP 1 111 772 A 6/2001

OTHER PUBLICATIONS

PCT International Search Report, PCT/IB2007/052298, mailing date Apr. 4, 2008.

* cited by examiner

*Primary Examiner* — Lana N Le
(74) *Attorney, Agent, or Firm* — Hogan Lovells US LLP

(57) ABSTRACT

A mixer circuit to mix a RF (Radio Frequency) signal with a LO (Local Oscillator) signal to generate an IF (Intermediate Frequency) signal including a dummy branch connected in parallel of a mixing branch, the dummy branch including a transconductance stage having an input connected to a reference potential independent from the RF signal, to transform the reference potential into a current signal, and a current switching core to switch the current signal according to LO and signals, and chopping switches to connect in series the transconductance stage of the mixing branch to the current switching core of the mixing branch and, in the alternative, to the current switching core of the dummy branch under the control of a chopping signal.

16 Claims, 4 Drawing Sheets

MIXER CIRCUIT AND METHOD OF OPERATION

CROSS-REFERENCE TO RELATED APPLICATIONS

The present application is a national filing in the U.S. Patent & Trademark Office of PCT/IB2007/052298 filed Jun. 15, 2007, and claims priority of EPO Patent Application No. 06300726.4 filed Jun. 27, 2006, both of which applications are incorporated herein in their entireties by this reference.

FIELD OF THE INVENTION

The present invention relates to a mixer circuit and a method to operate this mixer circuit.

BACKGROUND OF THE INVENTION

In direct conversion and zero-IF (Intermediate Frequency) receivers, it is necessary to maintain the spectral purity of the channel used for reception. Because of limited narrow band selectivity, second order intermodulation distortion (IM2) presents an undesired spectral component within the signal band of interest. This occurs when two or more interfering signals, whose difference in frequency is less than the IF bandwidth of the desired signal, mix with one another due to some second order nonlinearity and produce a baseband spectral component. To minimize the effects of second order intermodulation within critical circuit blocks in the signal path, it is known in the art to use differential circuits. In theory, differential circuits have infinite attenuation to second order intermodulation distortion. In reality, this is far from the truth; due, in no small part, to device mismatches, parametric imbalance, imperfect layout, and other device characteristic inequalities that cause imbalances and provides a lower than desired second order input intercept point (IIP2).

IM2 and IIP2 are further defined in EP 1 111 772, for example.

EP 1 111 772 discloses several embodiments of a mixer circuit. Most of these embodiments are double-balanced mixer circuits that need a differential RF (Radio Frequency) signal as inputs.

In FIG. 8 of EP 1 111 772 a single balanced mixer circuit is disclosed that needs not a differential RF signal as inputs. This single balanced mixer circuit mixes the RF signal with a LO (Local Oscillator) signal to generate an IF (Intermediate Frequency) signal. This single balanced mixer circuit has a mixing branch including:

a transconductance stage having an RF input to receive the RF signal to transform into a current signal, and a current switching core to switch the current signal according to the LO signal and an $\overline{LO}$ signal which forms with the LO signal a differential signal.

However, this single-balanced mixer circuit does not properly reject the LO signal or harmonic of the LO signal in the IF signal.

SUMMARY OF THE INVENTION

Accordingly, it is an object of the invention to provide a mixer circuit which does not need a differential RF signal as inputs while properly rejecting LO signal or LO signal harmonic in the outputted IF signal.

The invention provides a mixer circuit that in addition of the mixing branch has:

a dummy branch connected in parallel of the mixing branch (4), the dummy branch comprising:

a transconductance stage having an input connected to a reference potential which is independent from the RF signal, to transform the reference potential into a current signal, and a current switching core to switch the current signal according to LO and $\overline{LO}$ signals, and chopping switches to connect in series the transconductance stage of the mixing branch to the current switching core of the mixing branch and, in alternance, to the current switching core of the dummy branch under the control of a chopping signal.

In the above mixer the use of chopping switches increases the IIP2. Furthermore, the dummy branch prevents the LO signal from passing to the IF signal. Thus, the above mixer circuit achieves a better noise rejection that the embodiment of FIG. 8 of EP 1 111 772 while still achieving equivalent or better IIP2.

The embodiments of the above terminal may comprise one or several of the following features:

the chopping switches are able to connect in series the transconductance stage of the dummy branch to the current switching core of the dummy branch and, in alternance, to the current switching core of the mixing branch under the control of the chopping signal, the mixer circuit has a chopping signal generator able to generate the chopping signal which is a pseudo-random bit sequence that systematically has as many logical zeros as logical ones over one period, the pseudo-random bit sequence generator comprises:

a pseudo-random bit sequence builder which builds a pseudo-random bit sequence having a period $T_B$ and having a number of logical zeros different from the number of logical ones over period $T_B$, and a reversing core able to output, in alternance, the built pseudo-random bit sequence and its opposite so as to output a longer pseudo-random bits sequence having exactly as many logical zeros as logical ones over each period of this longer pseudo-random bit sequence, the current switching core is series connected with the transconductance stage through a filter having a cut-off frequency strictly higher than zero, and the current switching core is connected between a DC current source and a DC current sink and wherein the transconductance stage is directly connected to another DC current source without passing through one of the current switching stages.

The above embodiments of the mixer circuit present the following advantages:

cross-switching the connection of the transconductance stage of the mixing and dummy branches with the current switching core of the mixing and dummy branches improves the rejection of the LO signal in the generated IF signal, generating a pseudo-random bit sequence which has systematically as many logical zeros as logical ones improves IM2 cancellation, using a reversing core at the output of a pseudo-random bit sequence builder to obtain the pseudo-random bit sequence having as many logical zeros as logical ones does not impose any constraint to the choice of the pseudo-random bit sequence builder, using a filter having a cut-off frequency strictly higher than zero allows for cancellation of IM2 produced by the chopping switches, and having the transconductance stage directly connected to a DC current source without passing through one of the current switching stages, decreases the power consumption of the mixer circuit.

The invention also relates to a method of operating the above mixer circuit.

PREFERRED EMBODIMENTS

Figure 1:
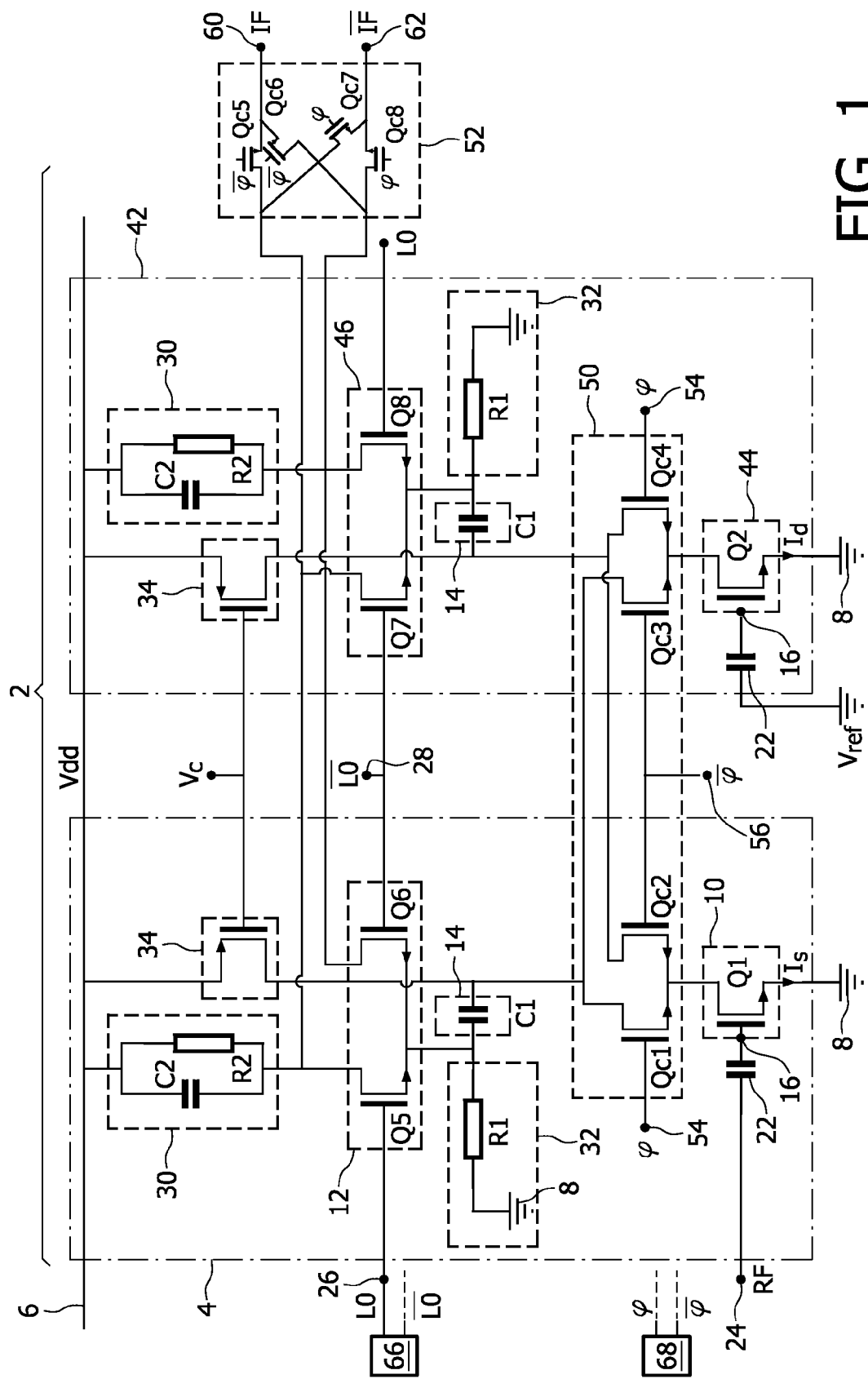
FIG. 1 is a schematic diagram of a mixer circuit.

FIG. 1 shows a mixer circuit 2 which is intended to mix LO signal with an RF signal to obtain the IF signal.

To this end, circuit 2 has a mixing branch 4 connected between a DC supply line 6 and a reference potential 8 like ground.

Branch 4 has a transconductance stage 10 which is connected to a current switching core 12 through a filter 14.

Stage 10 is able to transform the RF signal received on an input 16 into a current signal $I_s$. For example, stage 10 includes a transistor $Q_1$ having a base connected to an input 16, an emitter connected to ground 8 and a collector connected to core 12 though filter 14.

Input 16 is connected to a RF input 24 through a capacitor 22.

Current switching core 12 is designed to switch current $I_s$ according to the LO signal.

For example, core 12 includes two transistors $Q_5$ and $Q_6$, emitters of which are connected together. The base of transistors $Q_5$ and $Q_6$ are directly connected to an LO input 26 and a $\overline{LO}$ input 28, respectively. Inputs 26 and 28 receive LO signal 26 and $\overline{LO}$ signal, respectively. $\overline{LO}$ signal is equal to LO signal multiplied by "−1".

The collector of transistor $Q_5$ is connected to a voltage load 30. For example, load 30 is built from a resistor $R_2$ connected in parallel with a capacitor $C_2$. Load 30 is connected between line 6 and the collector of transistor $Q_5$.

The emitter of transistors $Q_5$ and $Q_6$ are connected through filter 14 to the collector of transistor $Q_1$. The emitters of $Q_5$ and $Q_6$ are also connected to a DC current source 32. For example, DC current source 32 is a single resistor $R_1$ connected on one side to the emitters of transistors $Q_5$ and $Q_6$ and on the other side to ground.

Filter 14 has a cut-off frequency which is strictly higher than zero so that only frequency component of current $I_s$ which are different from zero can pass through filter 14. For example, filter 14 is a capacitor $C_1$. One plate of capacitor $C_1$ is directly connected to the emitters of transistors $Q_5$ and $Q_6$ whereas the opposite plate is connected to the collector of transistor $Q_1$. The opposite plate is also connected to a DC current source 34. For example, source 34 is a transistor having an emitter connected to line 6 and a collector connected to both filter 14 and the collector of transistor $Q_1$. The base of the transistor is connected to a voltage source $V_c$ which determines the amount of current generated by source 34.

Mixer circuit 2 has also a dummy branch 42 which is connected in parallel of branch 4 between line 6 and ground 8.

Branch 42 is identical to branch 40 except that the transconductance stage input receives a constant reference voltage $V_{REF}$ instead of the RF signal. More precisely, branch 42 has a transconductance stage 44 that converts voltage $V_{REF}$ into a current signal $I_d$ and a current switching core 46 that switches current $I_d$ according to LO and $\overline{LO}$ signals.

Stage 44 and current switching core 46 are identical to stage 10 and current switching core 12, respectively. In FIG. 1, the transistor of stage 44 and the transistors of core 46 have numerical references $Q_2$, and $Q_7$, $Q_8$, respectively.

The other elements of branch 42 which are identical to those of branch 4 have the same numerical references.

More precisely, input 16 of stage 44 is connected through capacitor 22 to reference potential $V_{REF}$. For example, potential $V_{REF}$ is equal to ground 8.

Mixer circuit 2 also includes changeover means 50 and 52 to increase IIP2 without needing a very accurate calibration of branch 4 components in relation to branch 42 components.

Changeover means 50 are able to connect:

stage 10 to current switching core 12 and stage 44 to current switching core 46 and, in alternative, stage 10 to current switching core 46 and stage 44 to current switching core 12.

For instance, changeover means 50 include four chopping switches $Q_{C1}$, $Q_{C2}$, $Q_{C3}$ and $Q_{C4}$. Switches $Q_{C1}$, $Q_{C2}$, $Q_{C3}$ and $Q_{C4}$ are transistors that switch under the control of a chopping signal ϕ and a reverse chopping signal $\overline{\phi}$. Signal $\overline{\phi}$ is equal to signal ϕ multiplied by "−1".

Changeover means 50 are interposed between filters 14 and transconductance stages 10 and 44. More precisely, emitters of transistors $Q_{C1}$ and $Q_{C2}$ are directly connected to the collector of transistor $Q_1$ and emitters of $Q_{C3}$ and $Q_{C4}$ are directly connected to the collector of transistor $Q_2$.

Collectors of $Q_{C1}$ and $Q_{C3}$ are directly connected to filter 14 and current source 34 of branch 4. Collectors of transistors $Q_{C2}$ and $Q_{C4}$ are directly connected to filter 14 and current source 34 of branch 42.

The bases of transistors $Q_{C1}$ and $Q_{C4}$ are connected to an input 54 to receive signal ϕ and bases of transistors $Q_{C2}$ and $Q_{C3}$ are connected to an input 56 to receive signal Changeover means 52 are arranged so that whether current $I_s$ is switched by core 12 or by core 46, the resulting current is always outputted through an IF terminal 60 and the resulting reversed current is always outputted through an IF terminal 62.

Changeover means 52 are also arranged so that whether current $I_d$ is switched by core 12 or, in alternance by core 46, the resulting switched current is always outputted through an $\overline{IF}$ terminal 62.

For example, changeover means 52 include four chopping switches $Q_{C5}$, $Q_{C6}$, $Q_{C7}$ and $Q_{C8}$. Here switches $Q_{C5}$ to $Q_{C8}$ are transistors. The collectors of switches $Q_{C5}$ and $Q_{C8}$ are directly connected to the collectors of transistors $Q_5$ and $Q_6$, respectively. The collectors of transistors $Q_{C5}$ and $Q_{C8}$ are also directly connected to collectors of transistors $Q_7$ and $Q_8$, respectively.

The emitters of transistors $Q_{C5}$ and $Q_{C8}$ are directly connected to terminals 60 and 62, respectively.

The collectors of transistors $Q_{C6}$ and $Q_{C7}$ are directly connected to the collectors of transistors $Q_6$ and $Q_5$, respectively. The collectors of transistors $Q_{C6}$ and $Q_{C7}$ are also directly connected to the collectors of transistors $Q_8$ and $Q_7$, respectively. Emitters of transistors $Q_{C6}$ and $Q_{C7}$ are directly connected to terminals 60 and 62, respectively.

The bases of transistors $Q_{C5}$ and $Q_{C6}$ receives signal $\bar{\phi}$ whereas the bases of transistors $Q_{C7}$ and $Q_{C8}$ receives signal $\phi$.

Finally, mixer circuit 2 has also a generator 66 that generates LO and $\overline{LO}$ signals and a chopping signal generator 68 that generates signals $\phi$ and $\bar{\phi}$.

For simplicity, the connections between the outputs of generators 66 and 68 and every branch inputs have not been shown as illustrated by the dotted lines.

Figure 2:
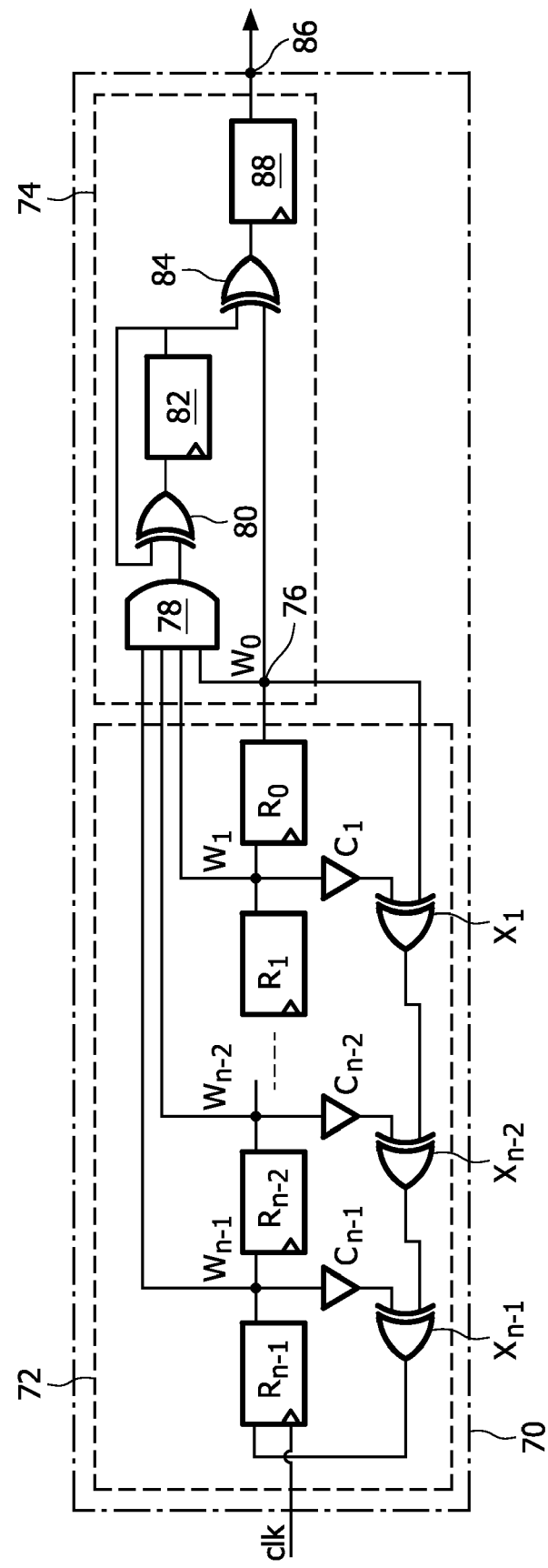
FIG. 2 is a schematic diagram of a pseudo-random bit generator used in the mixer circuit of FIG. 1.

FIG. 2 illustrates a pseudo-random bit sequence generator 70 which is used in generator 68. Generator 70 is designed to output a pseudo-random bit sequence which systematically has as many logical zeros as logical ones. This greatly improves the IIP2.

For example, generator 70 has a pseudo-random bit sequence builder 72 and a reversing core 74.

Builder 72 outputs pseudo-random bit sequence $W_0$ through output terminal 76. The pseudo-random bit sequence has a period $T_B$.

For instance, builder 72 is a feedback shift register having n series connected registers $R_0$ to $R_{n-1}$. Each register delays by one clock period the logical value present at its entrance. Each register is clocked by a clock signal clk.

Registers $R_0$ to $R_{n-1}$ output the values $W_0$ to $W_{n-1}$, respectively. Each output of registers $R_0$ to $R_{n-1}$ is feedback connected to the entrance of register $R_{n-1}$ through a respective block $C_i$ and a respective XOR gate $X_i$. Block $C_i$ either directly connects the output of register $R_i$ to an input of XOR gate $X_i$ or systematically outputs a zero at the input of XOR gate $X_i$. Preferably, blocks $C_i$ are chosen so as to provide a maximum length pseudo-random sequence according to Galois' theory, for example. In that case, for n registers, during one period, the outputted signal by builder 72 contains $2^{n-1}-1$ even values and $2^{n-1}$ odd values. Thus, the number of logical zeros is not equal to the number of logical ones in the output of builder 72.

To obviate this problem, the output of builder 72 is connected to reverse core 74. Reverse core 74 outputs the pseudo-random sequence generated by builder 72 and, in alternative, the opposite pseudo-random bit sequence. The opposite pseudo-bit random sequence is obtained by substituting in the pseudo-random sequence each logical zero by a logical one and each logical one by a logical zero.

For example, reversing core 74 has a AND gate 78 designed to make a AND operation between each value outputted by registers $R_0$ to $R_{n-1}$. The output of gate 78 is connected to an input of an XOR gate 80. The output of gate 80 is connected to an input of a register 82. The output of register 82 is connected to a second input of gate 80.

The output of register 82 is also connected to a first input of an XOR gate 84. The second input of XOR gate 84 is directly connected to the output of register $R_0$. The output of gate 84 is connected to an output 86 of generator 70 through a register 88.

When the output of register 82 is equal to zero, output 86 outputs a pseudo-random bit sequence which is equal to the pseudo-random bit sequence built by builder 72. When the output of register 82 is equal to one, output 86 outputs a pseudo-random bit sequence which is the opposite of the pseudo-random bit sequence built by builder 72.

More precisely, reversing core 74 detects the end of a period of the pseudo-random bits sequence generated by builder 72 when each value $W_0$ to $W_{n-1}$ are equal to a logical one. In response, the output of register 82 shifts from zero to one or conversely from one to zero. The value of the output of register 82 remains constant as long as the end of the period of the pseudo-random bit sequence generated by builder 72 has not been reached. Thus, the pseudo-random bit sequence outputted through output 86 has a period of $2T_B$ and is made from one pseudo-random bit sequence followed by the opposite pseudo-random bit sequence. As a consequence, the pseudo-random bit sequence outputted through output 86 has as many logical ones as logical zeros.

Figure 3:
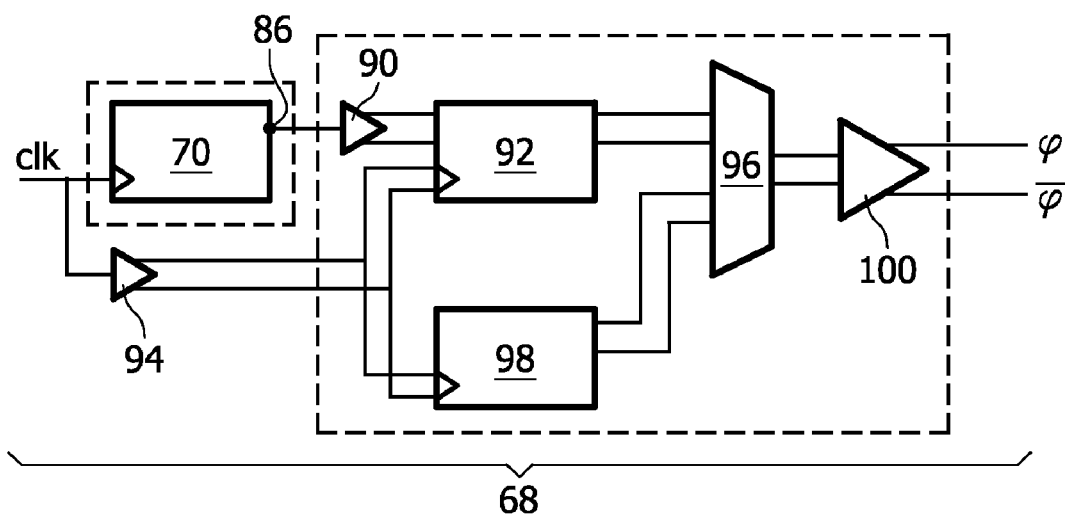
FIG. 3 is a schematic diagram of a chopping signal generator used in the mixer circuit of FIG. 1, FIGS. 4A and 4B are timing charts of clock signal used in the generator of FIG. 3.

FIG. 3 shows in more details generator 68.

Generator 68 includes pseudo-random bit sequence generator 70 which is clocked by a clock signal clk. The output 86 of generator 70 is connected to a buffer 90, output of which is connected to an input of a register 92. Register 92 is clocked by signal clk which is passed through a buffer 94. The output of register 92 is connected to an input of a multiplexer 96. The clock outputted by buffer 94 is also inputted in a clock divider 98. The output of divider 98 is connected to an input of multiplexer 96.

Divider 98 divides by two the frequency of the clock signal clk so as to obtain a square wave having a duty cycle very close to 50% even if the clock signal is not ideal.

The output of multiplexer 96 is connected to the input of a buffer 100 which outputs both signals $\phi$ and $\bar{\phi}$.

Generator 68 is able to output a pseudo-random bit sequence having as many logical ones as logical zeros when multiplexer 96 selects the signals outputted through register 92 and, in alternative, to output a square wave having a duty cycle equal or very close to 50% when multiplexer 96 selects the output of divider 98.

Square waves and pseudo-random bit sequence are of interest in different situations as explained in EP 1 111 772.

Figure 4A:
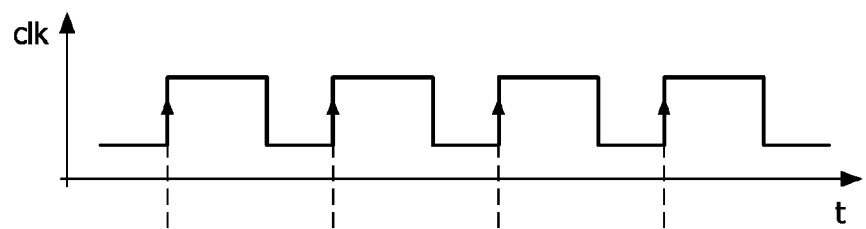
Figure 4B:
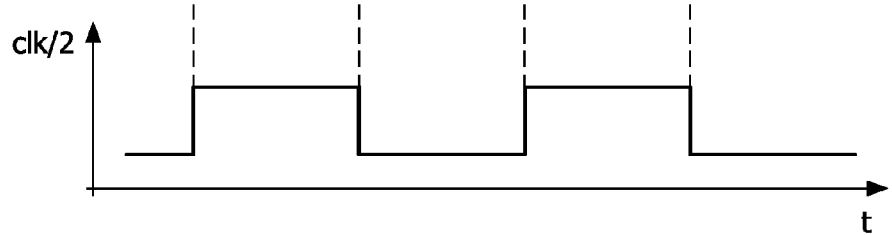

FIGS. 4A and 4B show timing charts illustrating how divider 98 works. FIG. 4A shows a clock signal clk which has a duty cycle very far from 50%. In FIG. 4A, the duty cycle is close to 60%.

Divider 98 output shifts from a logical one to a logical zero and vice versa only at each rising edge of the clock signal. Thus, as can be seen from FIG. 4B, the duty cycle of the wave outputted by divider 98 becomes very close to 50% even if the clock cycle of the inputted clock signal is far away from this value.

Having a duty cycle close to 50% increases the IIP2.

Figure 5:
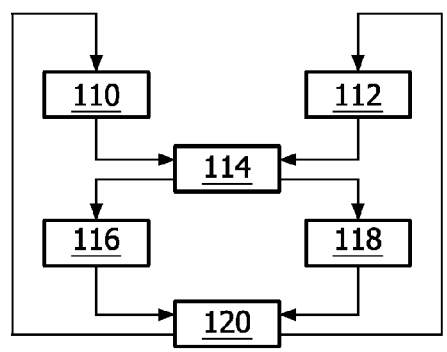
FIG. 5 is a flowchart of a method to operate the mixer circuit of FIG. 1.

The operation of mixer circuit 2 will now be described with reference to FIG. 5. In step 110, RF signal is inputted through input 24 to the transconductance stage. Thus, in step 110, stage 10 generates a current $I_s$ corresponding to the RF signal.

In parallel, in step 112, the reference potential $V_{REF}$ is inputted in transconductance stage 44 and stage 44 generates a current signal $I_d$ corresponding to potential $V_{REF}$.

Subsequently, in step 114, changeover means 50 connect stage 10 to current switching core 12 and stage 44 to current switching core 46.

Thus, in a step 116, switching core 12 switches current signal $I_s$ according to LO and $\overline{LO}$ signals.

In parallel, in step 118, current signal $I_d$ is switched by switching core 46 according to LO and $\overline{LO}$ signals.

Subsequently, in response to chopping signals $\phi$, $\bar{\phi}$ changes, in step 120, changeover means 50 disconnect stage 10 from current switching core 12 and connect stage 10 to current switching core 46. At the same time, changeover means 50 disconnect stage 44 from current switching core 46 and connect stage 44 to current switching core 12.

Thus, current signal $I_s$ is then switched by current switching core 46 and current signal $I_d$ is switched by current switching core 12.

Then the operations are iterated.

Switching the current signal in alternative with current switching cores 12 and 46 increases IIP2 as disclosed in EP 1 111 772.

Many other embodiments are possible. For example, chopping switches $Q_{C1}$, $Q_{C2}$, $Q_{C3}$ and $Q_{C4}$ may be placed elsewhere in the mixer circuit. For example, switches $Q_{C1}$, $Q_{C2}$, $Q_{C3}$ and $Q_{C4}$ may be placed at the same place as disclosed in the different embodiments of EP 1 111 772.

The invention claimed is:

1. A mixer circuit to mix a RF (Radio Frequency) signal with a LO (Local Oscillator) signal to generate an IF (Intermediate Frequency) signal, the mixer having a mixing branch comprising:
   a first transconductance stage having an RF input to receive the RF signal to transform into a current signal;
   a first current switching core to switch the current signal according to the LO signal and an $\overline{LO}$ signal which forms with the LO signal a differential signal;
   a dummy branch connected in parallel of the mixing branch, the dummy branch comprising:
   a second transconductance stage having an input connected to a reference potential which is independent from the RF signal, to transform the reference potential into a current signal; and
   a second current switching core to switch the current signal according to LO and $\overline{LO}$ signals; and
   chopping switches to connect in series the transconductance stages of the mixing branch to the first current switching core and, in the alternative, to the second current switching core under the control of a chopping signal,
   wherein the mixer circuit further comprises a chopping signal generator able to generate the chopping signal which is a pseudo-random bit sequence that systematically includes as many logical zeros as logical ones over one period, and wherein the pseudo-random bit sequence generator comprises:
   a pseudo-random bit sequence builder which builds a pseudo-random bit sequence having a period $T_B$ and having a number of logical zeros different from the number of logical ones over period $T_B$; and
   a reversing core able to alternatively output the built pseudo-random bit sequence and its opposite so as to output a longer pseudo-random bits sequence having as many logical zeros as logical ones over each period of this longer pseudo-random bit sequence.

2. The mixer circuit according to claim 1, wherein the first current switching core is series connected with the first transconductance stage through a filter.

3. The mixer circuit according to claim 1, wherein the second current switching core is series connected with the second transconductance stage through a filter.

4. The mixer circuit according to claim 1, wherein the first current switching core is connected between a DC current source and a DC current sink.

5. The mixer circuit according to claim 1, wherein the second current switching core is connected between a DC current source and a DC current sink.

6. The mixer circuit according to claim 1, wherein the first transconductance stage is directly connected to another DC current source without passing through one of the current switching stages.

7. The mixer circuit according to claim 1, wherein the second transconductance stage is directly connected to another DC current source without passing through one of the current switching stages.

8. A mixer circuit to mix a RF (Radio Frequency) signal with a LO (Local Oscillator) signal to generate an IF (Intermediate Frequency) signal, the mixer having a mixing branch comprising:
   a first transconductance stage having an RF input, and a current output;
   a first current switching core having a LO input, a current input, and a current output;
   a second transconductance stage having a reference input, and a current output;
   a second current switching core having a LO input, a current input, and a current output;
   a first set of chopping switches coupled between the current outputs of the first and second transconductance stages, and the current inputs of the first and second current switching cores; and
   a second set of chopping switches coupled between the current outputs of the first and second current switching cores, and an IF output,
   wherein the mixer circuit further comprises a chopping signal generator able to generate chopping signals for the first and second sets of chopping switches, which is a pseudo-random bit sequence that systematically includes as many logical zeros as logical ones over one period, and wherein the pseudo-random bit sequence generator comprises:
   a pseudo-random bit sequence builder which builds a pseudo-random bit sequence having a period $T_B$ and having a number of logical zeros different from the number of logical ones over period $T_B$; and
   a reversing core able to alternatively output the built pseudo-random bit sequence and its opposite so as to output a longer pseudo-random bits sequence having as many logical zeros as logical ones over each period of this longer pseudo-random bit sequence.

9. The mixer circuit according to claim 8, wherein the first current switching core is series connected with the first transconductance stage through a filter.

10. The mixer circuit according to claim 8, wherein the second current switching core is series connected with the second transconductance stage through a filter.

11. The mixer circuit according to claim 8, wherein the first current switching core is connected between a DC current source and a DC current sink.

12. The mixer circuit according to claim 8, wherein the second current switching core is connected between a DC current source and a DC current sink.

13. The mixer circuit according to claim 8, wherein the first transconductance stage is coupled to ground.

14. The mixer circuit according to claim 8, wherein the second transconductance stage is coupled to ground.

15. A method of mixing a RF (Radio Frequency) signal with a LO (Local Oscillator) signal to generate an IF (Intermediate Frequency) signal, the method comprising:
   generating a first current from an RF input;
   generating a second current from a reference input;
   providing a first current switching core under the control of an LO signal;
   providing a second current switching core under the control of the LO signal;
   switching the first current between the first and second switching cores under the control of a chopping signal;
   switching the second current between the first and second switching cores under the control of the chopping signal;
   using a current output of the first and second current switching cores to generate an IF output; and
   providing a chopping signal generator able to generate the chopping signals, which is a pseudo-random bit sequence that systematically includes as many logical zeros as logical ones over one period, and wherein the pseudo-random bit sequence generator comprises:

a pseudo-random bit sequence builder which builds a pseudo-random bit sequence having a period $T_B$ and having a number of logical zeros different from the number of logical ones over period $T_B$; and a reversing core able to alternatively output the built pseudo-random bit sequence and its opposite so as to output a longer pseudo-random bits sequence having as many logical zeros as logical ones over each period of this longer pseudo-random bit sequence.

16. The method according to claim 15, further comprising generating the chopping signal using a pseudo-random bit sequence that systematically includes as many logical zeros as logical ones over one period.

\* \* \* \* \*